United States Patent
Ryu et al.

(10) Patent No.: US 11,078,318 B2
(45) Date of Patent: Aug. 3, 2021

(54) BLOCK COPOLYMER

(71) Applicant: LG Chem, Ltd., Seoul (KR)

(72) Inventors: Hyung Ju Ryu, Daejeon (KR); Je Gwon Lee, Daejeon (KR); Se Jin Ku, Daejeon (KR); Eun Young Choi, Daejeon (KR); Sung Soo Yoon, Daejeon (KR); No Jin Park, Daejeon (KR); Jung Keun Kim, Daejeon (KR); Mi Sook Lee, Daejeon (KR)

(73) Assignee: LG Chem, Ltd.

( * ) Notice: Subject to any disclaimer, the term of this patent is extended or adjusted under 35 U.S.C. 154(b) by 84 days.

(21) Appl. No.: 16/346,299

(22) PCT Filed: Nov. 29, 2017

(86) PCT No.: PCT/KR2017/013793
§ 371 (c)(1),
(2) Date: Apr. 30, 2019

(87) PCT Pub. No.: WO2018/101732
PCT Pub. Date: Jun. 7, 2018

(65) Prior Publication Data
US 2019/0292291 A1    Sep. 26, 2019

(30) Foreign Application Priority Data
Nov. 30, 2016 (KR) .................. 10-2016-0162130

(51) Int. Cl.
| | | |
|---|---|---|
| *C08F 212/04* | (2006.01) | |
| *C08F 220/18* | (2006.01) | |
| *C08F 299/02* | (2006.01) | |
| *C08L 53/00* | (2006.01) | |
| *H01L 21/027* | (2006.01) | |
| *H01L 21/311* | (2006.01) | |
| *C08J 5/22* | (2006.01) | |
| *G03F 1/00* | (2012.01) | |
| *C08F 220/38* | (2006.01) | |
| *C08F 220/22* | (2006.01) | |
| *C08F 297/02* | (2006.01) | |

(52) U.S. Cl.
CPC ........ *C08F 299/024* (2013.01); *C08F 212/04* (2013.01); *C08F 220/18* (2013.01); *C08F 220/22* (2013.01); *C08F 220/38* (2013.01); *C08F 297/02* (2013.01); *C08J 5/22* (2013.01); *C08L 53/00* (2013.01); *G03F 1/00* (2013.01); *H01L 21/027* (2013.01); *H01L 21/311* (2013.01); *C08L 2203/16* (2013.01)

(58) Field of Classification Search
CPC .... C08F 212/04; C08F 220/18; C08F 220/22; C08F 220/38; C08F 293/00; C08F 293/005; C08F 297/02; C08F 297/026; C08F 297/06; C08F 295/00; C08F 299/024; C08F 2438/03; C08J 5/22; C08J 5/2218; C08L 53/00; C08L 2203/16; C09D 153/00
See application file for complete search history.

(56) References Cited

U.S. PATENT DOCUMENTS

| | | |
|---|---|---|
| 5,391,626 A | 2/1995 | Machida et al. |
| 8,618,221 B2 | 12/2013 | Nealey et al. |
| 10,081,698 B2 | 9/2018 | Lee et al. |
| 2015/0093508 A1 | 4/2015 | Nagai et al. |
| 2015/0099109 A1 | 4/2015 | Gopalan et al. |
| 2015/0225601 A1 | 8/2015 | Komatsu et al. |
| 2016/0280832 A1 | 9/2016 | Kim et al. |
| 2016/0293408 A1 | 10/2016 | Komatsu et al. |
| 2016/0304653 A1 | 10/2016 | Kim et al. |
| 2017/0210938 A1 | 7/2017 | Ku et al. |

FOREIGN PATENT DOCUMENTS

| | | |
|---|---|---|
| CN | 105980342 A | 9/2016 |
| JP | 2001294617 A | 10/2001 |
| JP | 2002145973 A | 5/2002 |
| JP | 2015166438 A | 9/2015 |
| KR | 20150067069 A | 6/2015 |
| KR | 20160117269 A | 10/2016 |
| TW | 201538547 A | 10/2015 |
| TW | 201629113 A | 8/2016 |

OTHER PUBLICATIONS

International Search Report for Application No. PCT/KR2017/013793 dated Mar. 21, 2018.
Chinese Search Report for Application No. 201780067383.6 dated Nov. 6, 2020, 2 pages.

*Primary Examiner* — Irina S Zemel
*Assistant Examiner* — Jeffrey S Lenihan
(74) *Attorney, Agent, or Firm* — Lerner, David, Littenberg, Krumholz & Mentlik, LLP

(57) ABSTRACT

The present application may provide a block copolymer and a use thereof. The block copolymer of the present application has excellent self-assembly properties or phase separation characteristics, to which various functions to be required can also be freely imparted.

15 Claims, 2 Drawing Sheets

[Figure 1]
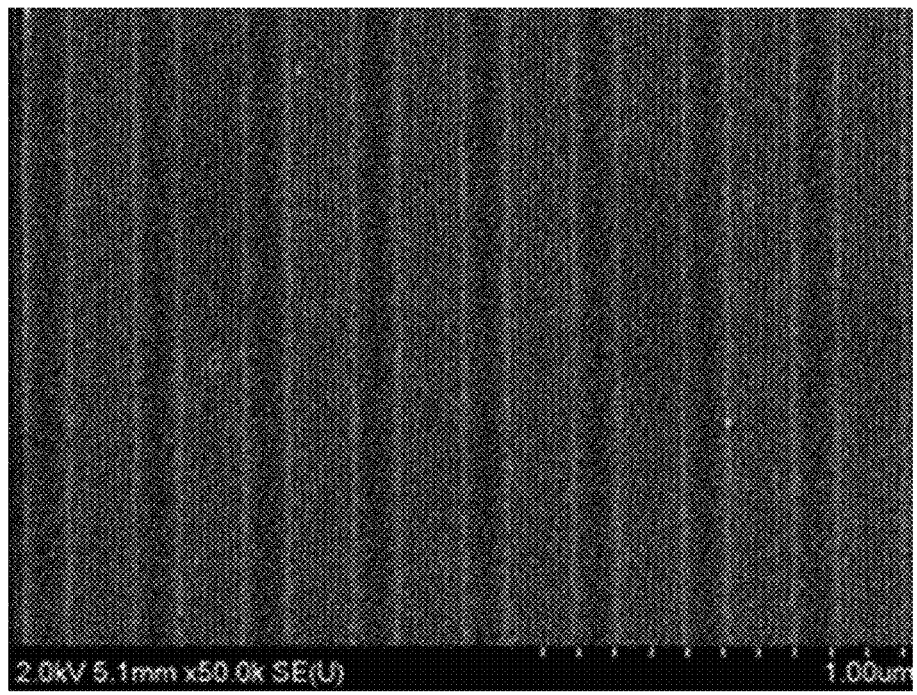
[Figure 2]
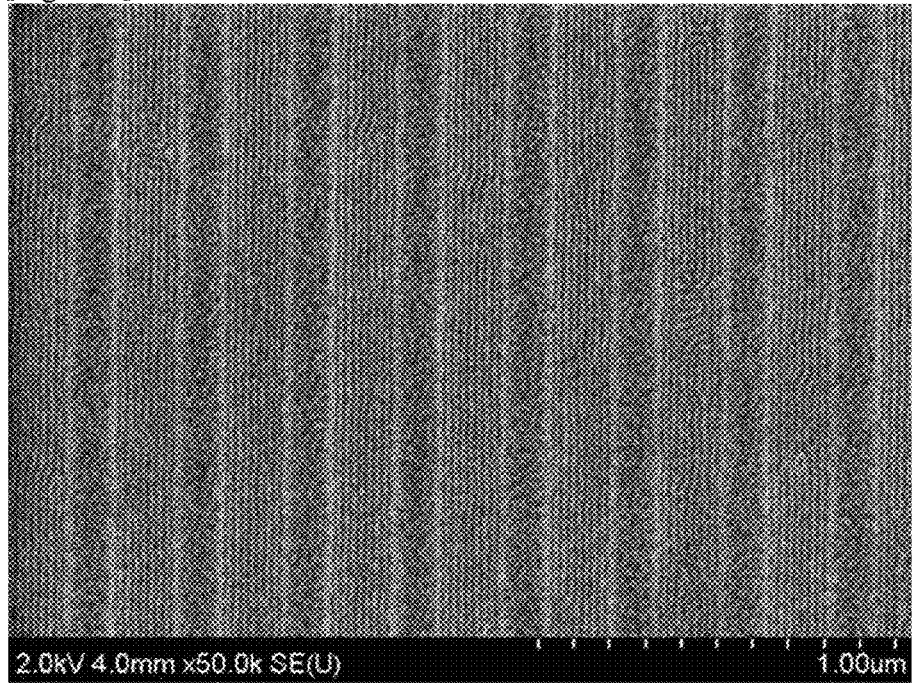

[Figure 3]
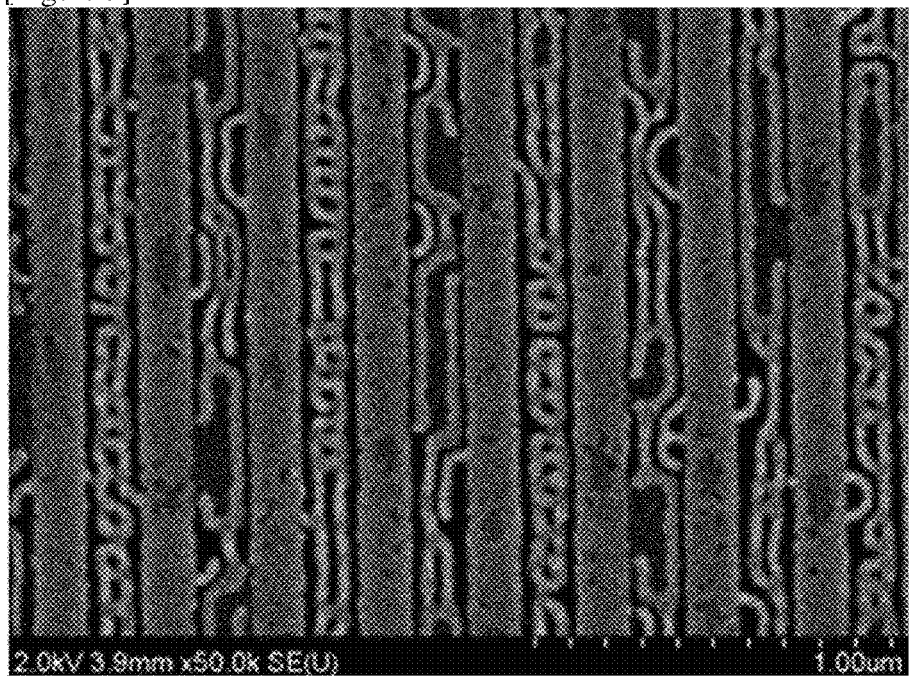

BLOCK COPOLYMER

CROSS-REFERENCE TO RELATED APPLICATIONS

The present application is a national phase entry under 35 U.S.C. § 371 of International Application No. PCT/KR2017/013793 filed Nov. 29, 2017, which claims priority from Korean Patent Application No. 10-2016-0162130 filed Nov. 30, 2016, all of which are incorporated herein by reference.

TECHNICAL FIELD

The present application relates to a block copolymer.

BACKGROUND ART

A block copolymer has a molecular structure in which polymer segments having different chemical structures are linked via covalent bonds. The block copolymer can form a periodically arranged structure such as a sphere, a cylinder or a lamella by phase separation. The domain size of the structure formed by a self-assembly phenomenon of the block copolymer can be widely controlled and various types of structures can be manufactured, so that the block copolymer can be applied to high density magnetic storage media, nanowire fabrication, various next-generation nano devices such as quantum dots or metal dots or magnetic recording media, or pattern formation by lithography, and the like.

DISCLOSURE

Technical Problem

The present application provides a block copolymer and a use thereof.

Technical Solution

In this specification, the term alkyl group may mean an alkyl group having 1 to 20 carbon atoms, 1 to 16 carbon atoms, 1 to 12 carbon atoms, 1 to 8 carbon atoms or 1 to 4 carbon atoms, unless otherwise specified. The alkyl group may be a linear, branched or cyclic alkyl group, which may be optionally substituted with one or more substituents.

In this specification, the term alkoxy group may mean an alkoxy group having 1 to 20 carbon atoms, 1 to 16 carbon atoms, 1 to 12 carbon atoms, 1 to 8 carbon atoms or 1 to 4 carbon atoms, unless otherwise specified. The alkoxy group may be a linear, branched or cyclic alkoxy group, which may be optionally substituted with one or more substituents.

The term alkenyl group or alkynyl group herein means an alkenyl group or alkynyl group having 2 to 20 carbon atoms, 2 to 16 carbon atoms, 2 to 12 carbon atoms, 2 to 8 carbon atoms or 2 to 4 carbon atoms, unless otherwise specified. The alkenyl or alkynyl group may be linear, branched or cyclic, which may be optionally substituted with one or more substituents.

The term alkylene group herein may mean an alkylene group having 1 to 20 carbon atoms, 1 to 16 carbon atoms, 1 to 12 carbon atoms, 1 to 8 carbon atoms or 1 to 4 carbon atoms, unless otherwise specified. The alkylene group may be a linear, branched or cyclic alkylene group, which may be optionally substituted with one or more substituents.

The term alkenylene group or alkynylene group herein may mean an alkenylene group or alkynylene group having 2 to 20 carbon atoms, 2 to 16 carbon atoms, 2 to 12 carbon atoms, 2 to 8 carbon atoms or 2 to 4 carbon atoms. The alkenylene group or alkynylene group may be linear, branched or cyclic, which may be optionally substituted with one or more substituents.

The term aryl group or arylene group herein may mean, unless otherwise specified, a monovalent residue or divalent residue derived from a compound comprising one benzene structure, or a structure in which two or more benzene rings are linked while sharing one or two carbon atoms, or linked by any linker, or a derivative thereof. The aryl group or arylene group may be, for example, an aryl group having 6 to 30 carbon atoms, 6 to 25 carbon atoms, 6 to 21 carbon atoms, 6 to 18 carbon atoms or 6 to 13 carbon atoms, unless otherwise specified.

In the present application, the term aromatic structure may mean the aryl group or arylene group.

In this specification, the term alicyclic ring structure means a cyclic hydrocarbon structure other than an aromatic ring structure, unless otherwise specified. The alicyclic ring structure may be, for example, an alicyclic ring structure having 3 to 30 carbon atoms, 3 to 25 carbon atoms, 3 to 21 carbon atoms, 3 to 18 carbon atoms or 3 to 13 carbon atoms, unless otherwise specified.

In the present application, the term single bond may mean a case where no separate atom is present at the relevant site. For example, in the structure represented by A-B-C, when B is a single bond, no separate atom exists at the site represented by B, and A and C are directly connected, so that it may mean to form a structure represented by A-C.

In the present application, the substituent, with which the alkyl group, alkenyl group, alkynyl group, alkylene group, alkenylene group, alkynylene group, alkoxy group, aryl group, arylene group, chain or aromatic structure, and the like may be optionally substituted, may be exemplified by a hydroxy group, a halogen atom, a carboxyl group, a glycidyl group, an acryloyl group, a methacryloyl group, an acryloyloxy group, a methacryloyloxy group, a thiol group, an alkyl group, an alkenyl group, an alkynyl group, an alkylene group, an alkenylene group, an alkynylene group, an alkoxy group or an aryl group, and the like, but is not limited thereto.

In one aspect of the present application, as the block copolymer, a block copolymer which comprises a polymer segment comprising a unit derived from a monomer having the following structure may be provided:

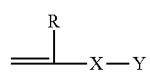

[Formula 1]

In Formula 1, R is hydrogen or an alkyl group, X is a single bond, an oxygen atom, a sulfur atom, $-S(=O)_2-$, a carbonyl group, an alkylene group, an alkenylene group, an alkynylene group, $-C(=O)-X_1-$ or $-X_1-C(=O)-$, where $X_1$ is an oxygen atom, a sulfur atom, $-S(=O)_2-$, an alkylene group, an alkenylene group or an alkynylene group, and Y is a monovalent substituent comprising a ring structure to which a chain having 8 or more chain-forming atoms is connected.

In another example, X in Formula 1 may be a single bond, an oxygen atom, a carbonyl group, $-C(=O)-O-$ or $-OC(=O)-$, or may be $-C(=O)-O-$, but is not limited thereto.

The monovalent substituent of Y in Formula 1 comprises a chain structure formed by at least eight chain-forming atoms.

In the present application, the term chain-forming atom means an atom forming a linear structure of a predetermined chain. The chain may be linear, or may be branched, but the number of chain-forming atoms is calculated by only the number of atoms forming the longest straight chain, where other atoms bonded to the chain-forming atoms (for example, when the chain-forming atom is a carbon atom, hydrogen atoms bonding to the carbon atom, etc.) are not calculated. In the case of a branched chain, the number of chain-forming atoms can be calculated as the number of chain-forming atoms forming the longest chain. For example, when the chain is an n-pentyl group, all of the chain-forming atoms are carbon, the number thereof is 5, and even if the chain is a 2-methylpentyl group, all of the chain-forming atoms are carbon, and the number thereof is 5. The chain-forming atom may be exemplified by carbon, oxygen, sulfur or nitrogen, and the like, and the appropriate chain-forming atom may be carbon, oxygen or nitrogen, or may be carbon or oxygen. The number of chain-forming atoms may be 8 or more, 9 or more, 10 or more, 11 or more, or 12 or more. The number of the chain-forming atoms may be 30 or less, 25 or less, 20 or less, or 16 or less.

When the compound of Formula 1 has formed a block copolymer to be described below, it may allow the block copolymer to exhibit excellent self-assembly properties due to the presence of the chain.

In one example, the chain may be a linear hydrocarbon chain such as a linear alkyl group. In this case, the alkyl group may be an alkyl group having 8 or more carbon atoms, 8 to 30 carbon atoms, 8 to 25 carbon atoms, 8 to 20 carbon atoms, or 8 to 16 carbon atoms. One or more of the carbon atoms in the alkyl group may optionally be substituted with an oxygen atom, and at least one hydrogen atom of the alkyl group may be optionally substituted by another substituent.

In Formula 1, Y may comprise a ring structure, and the chain may be connected to the ring structure. By such a ring structure, the self-assembly property and the like of the block copolymer formed by the monomer may be further improved. The ring structure may be an aromatic structure or an alicyclic structure.

The chain may be directly connected to the ring structure, or may be connected via a linker. The linker may be exemplified by an oxygen atom, a sulfur atom, $-NR_1-$, $-S(=O)_2-$, a carbonyl group, an alkylene group, an alkenylene group, an alkynylene group, $-C(=O)-X_1-$ or $-X_1-C(=O)-$, where $R_1$ may be hydrogen, an alkyl group, an alkenyl group, an alkynyl group, an alkoxy group or an aryl group, and $X_1$ may be a single bond, an oxygen atom, a sulfur atom, $-S(=O)_2-$, an alkylene group, an alkenylene group or an alkynylene group, where $R_2$ may be hydrogen, an alkyl group, an alkenyl group, an alkynyl group, an alkoxy group or an aryl group. The suitable linker may be exemplified by an oxygen atom or a nitrogen atom. The chain may be connected to a ring structure, for example, via an oxygen atom or a nitrogen atom. In this case, the linker may be an oxygen atom, or may be $-NR_1-$ (where $R_1$ is hydrogen, an alkyl group, an alkenyl group, an alkynyl group, an alkoxy group or an aryl group).

In one example, Y of Formula 1 may be represented by Formula 2 below.

  [Formula 2]

In Formula 2, P is an arylene group, Q is a single bond, an oxygen atom or where $R_3$ is hydrogen, an alkyl group, an alkenyl group, an alkynyl group, an alkoxy group or an aryl group, and Z is the chain having 8 or more chain-forming atoms. When Y in Formula 1 is the substituent of Formula 2, P of Formula 2 may be directly linked to X of Formula 1.

In Formula 2, a suitable example of P may be exemplified by an arylene group having 6 to 12 carbon atoms, for example, a phenylene group, but is not limited thereto.

In Formula 2, Q may included, as a suitable example, an oxygen atom or $-NR_1-$(where $R_1$ is hydrogen, an alkyl group, an alkenyl group, an alkynyl group, an alkoxy group or an aryl group).

A suitable example of the monomer of Formula 1 may include a compound in which in Formula 1, R is hydrogen or an alkyl group, for example, hydrogen or an alkyl group having 1 to 4 carbon atoms, X is $-C(=O)-O-$, and Y is a substituent, wherein in Formula 2, P is an arylene group having 6 to 12 carbon atoms or phenylene, Q is an oxygen atom, and Z is the aforementioned chain having at least 8 chain-forming atoms.

Thus, a suitable example monomer of Formula 1 may include a monomer of Formula 3 below.

[Formula 3]

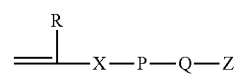

In Formula 3, R is hydrogen or an alkyl group having 1 to 4 carbon atoms, X is $-C(=O)-O-$, P is an arylene group having 6 to 12 carbon atoms, Q is an oxygen atom, and Z is the chain having 8 or more chain-forming atoms.

The block copolymer of the present application comprises a polymer segment comprising a unit represented by Formula 4 below as a polymer segment (hereinafter, may be referred to as polymer segment A) formed through the monomer. The polymer segment A may comprise a unit of Formula 4 below as a main component. In this specification, the fact that a polymer segment comprises a certain unit as a main component means a case where the relevant polymer segment comprises the unit 60% or more, 65% or more, 70% or more, 75% or more, 80% or more, 85% or more, or 90% or more, and comprises it 100% or less, by weight.

[Formula 4]

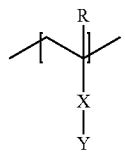

In Formula 4, R, X and Y may be applied equally to matters of R, X and Y in Formula 1, respectively.

Accordingly, in Formula 4, R may be hydrogen or an alkyl group having 1 to 4 carbon atoms, X may be a single bond, an oxygen atom, a sulfur atom, $-S(=O)_2-$, a carbonyl group, an alkylene group, an alkenylene group, an alkynylene group, $-C(=O)-X_1-$ or $-X_1-C(=O)-$, where $X_1$ is an oxygen atom, a sulfur atom, $-S(=O)_2-$, an alkylene group, an alkenylene group or an alkynylene group, and Y may be a monovalent substituent comprising a ring structure to which a chain having 8 or more chain-forming atoms is linked, where specific types of the respective substituents may also be applied equally to the contents as described above.

In one example, the polymer segment A may be a polymer segment in which in Formula 4, R is hydrogen or an alkyl group, for example, hydrogen or an alkyl group having 1 to 4 carbon atoms, X is —C(=O)—O—, and Y is the substituent of Formula 2. Such a polymer segment may be referred to as a polymer segment A1 herein, but is not limited thereto. The unit of Formula 4 may be represented by, for example, Formula 5 below.

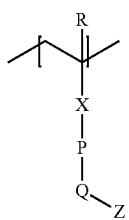

[Formula 5]

In Formula 5, R is hydrogen or an alkyl group having 1 to 4 carbon atoms, X is a single bond, an oxygen atom, —C(=O)—O— or —OC(=O)—, P is an arylene group, Q is an oxygen atom or —NR$_3$—, where R$_3$ is hydrogen, an alkyl group, an alkenyl group, an alkynyl group, an alkoxy group or an aryl group, and Z is a linear chain having 8 or more chain-forming atoms. In another example, Q in Formula 5 may be an oxygen atom.

The block copolymer comprises, together with the polymer segment A, polymer segments B and C different from the polymer segment A.

In the present application, the fact that two kinds of polymer segments are identical means any one case of cases in which in any two kinds of polymer segments the kinds of monomer units contained as the main component are identical to each other, or 50% or more, 55% or more, 60% or more, 65% or more, 70% or more, 75% or more, 80% or more, 85% or more or 90% or more of monomer unit kinds contained in two kinds of polymer segments are common and a weight ratio deviation of the common monomer units in each polymer segment is within 30%, within 25%, within 20%, within 20%, within 15%, within 10% or within 5%. If both polymer segments do not satisfy the two cases, they are polymer segments that are different from each other. Here, it may be proper that the ratio of the common monomer units is satisfied for both polymer segments. For example, if any polymer segment 1 has monomer units of A, B, C, D and F and the other polymer segment 2 has monomer units of D, F, G and H, then the common monomer units in polymer segments 1 and 2 are D and F, where in the position of polymer segment 1 the common ratio is 40% (=100×2/5) because two kinds of the total five kinds are common, but in the position of polymer segment 2 the ratio is 50% (=100× 2/5). Thus, in this case, both polymer segments may be regarded as not identical because the common ratio is not less than 50% only in polymer segment 2. On the other hand, the weight ratio deviation of the common monomers is a percentage of a numerical value in which a large weight ratio minus a small weight ratio is divided by the small weight ratio. For example, in the above case, if the weight ratio of the D monomer units in the segment 1 is about 40% based on 100% of the total weight ratio of the whole monomer units in the segment 1 and the weight ratio of the D monomer units in the segment 2 is about 30% based on 100% of the total weight ratio of the whole monomer units in the segment 2, the weight ratio deviation may be about 33% (=100×(40−30)/30) or so. If the common monomer units are two or more kinds in two segments, in order to be the same segment, it can be considered as the common monomers when the weight ratio deviation within 30% is satisfied for all the common monomers or for the monomer unit as the main component. Each polymer segment that is recognized as the same by the above criteria may be a different type of polymer (e.g., any one segment is in the form of a block copolymer and the other segment is in the form of a random copolymer), but it may be, suitably, the same type of polymer.

The block copolymer of the present application may have a structure in which the polymer segments B and C are connected on both sides with such a polymer segment A as the center, that is, a structure of B-A-C. Here, the polymer segments B and C may be the same segment or different segments from each other. Such a block copolymer may be a triblock copolymer including the above three segments, or may be a multi-block copolymer having three or more blocks.

In the present application, the specific kind of the polymer segment B or C is not particularly limited.

For example, the polymer segment B or C may be a polyvinyl pyrrolidone polymer segment, a polylactic acid polymer segment, a polyvinyl pyridine polymer segment, a polyalkyl (meth)acrylate segment such as polymethyl methacrylate, a polystyrene polymer segment such as polystyrene or polytrimethylsilylstyrene, a polyalkylene oxide polymer segment such as polyethylene oxide, a polybutadiene polymer segment, a polyisoprene polymer segment or a polyolefin polymer segment such as polyethylene. Such a polymer segment may be referred to as a polymer segment 2A herein.

In another example, the polymer segment B or C may be a polymer segment having an aromatic structure comprising one or more halogen atoms.

Such a polymer segment B or C may be, for example, a polymer segment comprising a unit represented by Formula 7 below. The polymer segment may comprise the unit of Formula 7 as a main component. Such a polymer segment may be referred to as a polymer segment 2B herein.

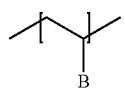

[Formula 7]

In Formula 7, B is a monovalent substituent having an aromatic structure comprising one or more halogen atoms.

When such a polymer segment B or C is present on at least one side of the above-mentioned polymer segment A, the block copolymer can exhibit excellent self-assembly properties and the like.

In Formula 7, the aromatic structure may be, for example, an aromatic structure having 6 to 18 carbon atoms or 6 to 12 carbon atoms.

Also, as the halogen atom contained in Formula 7, a fluorine atom or a chlorine atom can be exemplified, and appropriately, a fluorine atom can be used, without being limited thereto.

In one example, B in Formula 7 may be a monovalent substituent having an aromatic structure with 6 to 12 carbon atoms, substituted with 1 or more, 2 or more, 3 or more, 4 or more, or 5 or more halogen atoms. The upper limit of the number of halogen atoms is not particularly limited, where for example, 10 or less, 9 or less, 8 or less, 7 or less, or 6 or less halogen atoms may be present therein.

For example, Formula 7, which is the unit, contained in the polymer segment 2B may be represented by Formula 8 below.

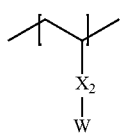

[Formula 8]

In Formula 8, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, and W is an aryl group containing at least one halogen atom. Here, W may be an aryl group substituted with at least one halogen atom, for example, an aryl group having 6 to 12 carbon atoms, substituted with 2 or more, 3 or more, 4 or more, or 5 or more halogen atoms.

The unit contained in the polymer segment 2B may be represented, for example, by Formula 9 below.

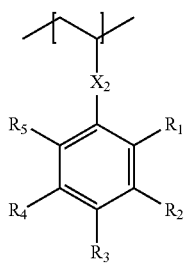

[Formula 9]

In Formula 9, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, $R_1$ to $R_5$ are each independently hydrogen, an alkyl group, a haloalkyl group or a halogen atom, and the number of halogen atoms contained in $R_1$ to $R_5$ is 1 or more.

In another example, $X_2$ in Formula 9 may be a single bond, an oxygen atom, an alkylene group, —C(=O)—O— or —O—C(=O)—.

In Formula 9, $R_1$ to $R_5$ may be each independently hydrogen, an alkyl group, a haloalkyl group or a halogen atom, but $R_1$ to $R_5$ may comprise 1 or more, 2 or more, 3 or more, 4 or more, or 5 or more halogen atoms, for example, fluorine atoms. The halogen atoms, for example, fluorine atoms contained in $R_1$ to $R_5$ may be 10 or less, 9 or less, 8 or less, 7 or less, or 6 or less.

Such a block copolymer of the present application can exhibit excellent phase separation or self-assembly properties basically.

In such a block copolymer, the volume fraction of the polymer segment A may be in a range of 0.3 to 0.7 or about 0.3 to 0.5, and the sum of the volume fractions of the polymer segments A, B and C may be 1. The block copolymer containing each polymer segment at such a volume fraction can exhibit excellent self-assembly properties. The volume fraction of each polymer segment of the block copolymer can be determined based on the density and the molecular weight measured by GPC (gel permeation chromatography), of each polymer segment.

The number average molecular weight (Mn) of the block copolymer is not particularly limited. However, upon forming a polymer film to be described below, in the case where the film has a thin thickness, if the number average molecular weight of the block copolymer is excessively large, it may be difficult to realize a proper self-assembly or phase separation structure. In this case, the number average molecular weight may be, for example, 70,000 or less. In this specification, the term number average molecular weight is a converted value for standard polystyrene measured using GPC (gel permeation chromatograph), and the term molecular weight herein means a number average molecular weight, unless otherwise specified. In another example, the molecular weight (Mn) may be, for example, 1,000 or more, 2,000 or more, 3,000 or more, 5,000 or more, 7,000 or more, 9,000 or more, 11,000 or more, 13,000 or more, 15,000 or more, 20,000 or more, 25,000 or more, 30,000 or more, 35,000 or more, or 40,000 or more. In another example, the molecular weight (Mn) may be 65,000 or less, or 60,000 or less or so.

The block copolymer may have a polydispersity (Mw/Mn) in a range of 1.01 to 1.60. In another example, the polydispersity may be about 1.1 or more, about 1.2 or more, about 1.25 or more, or about 1.3 or more. Also, in another example, the polydispersity may be about 1.55 or less, about 1.5 or less, 1.45 or less, 1.4 or less, or about 1.35 or less. The polydispersity may also be measured using GPC (gel permeation chromatograph).

In this range, the block copolymer may exhibit proper self-assembly properties. The number average molecular weight of the block copolymer or the like can be adjusted in consideration of the desired self-assembled structure and the like.

When the block copolymer comprises at least the polymer segments A, B and C, the ratio of the polymer segment A, for example, the polymer segment comprising the chain as described above, in the block copolymer may be in a range of 10 mol % to 90 mol %.

Such a block copolymer can be prepared in a known manner. For example, the block copolymer can be produced by an LRP (Living Radical Polymerization) method using monomers forming units of each polymer segment. For example, there are anionic polymerization in which the block copolymer is synthesized in the presence of an inorganic acid salt such as an alkali metal or an alkali earth metal by using an organic rare earth metal complex as a polymerization initiator or by using an organic alkali metal compound as a polymerization initiator, an anionic polymerization method in which the block copolymer is synthesized in the presence of an organic aluminum compound by using an organic alkali metal compound as a polymerization initiator, an atom transfer radical polymerization method (ATRP) using an atom transfer radical polymerization agent as a polymerization inhibitor, an ARGET (Activators Regenerated by Electron Transfer) atom transfer radical polymerization method (ATRP), which uses an atom transfer radical polymerization agent as a polymerization initiator, but performs polymerization under an organic or inorganic reducing agent that generates electrons, an ICAR (Initiators for Continuous Activator Regeneration) atom transfer radical polymerization method (ATRP), a polymerization method by reversible addition-fragmentation chain transfer (RAFT) using an inorganic reducing agent and a reversible addition-fragmentation chain transfer agent or a method of using an organotellurium compound as an initiator, and the like, and a suitable method may be selected among these methods and applied.

For example, the block copolymer can be prepared in a manner comprising polymerizing a reactant comprising monomers capable of forming the polymer segments in the presence of a radical initiator and a living radical polymerization reagent by a living radical polymerization method.

The method of forming other polymer segments included in the copolymer together with the polymer segment formed by using the monomer upon producing the block copolymer is not particularly limited, where a suitable monomer may be selected in consideration of the kind of the desired polymer segment, thereby forming the other polymer segments.

The process of producing the polymer segment copolymer may further comprise, for example, a process of precipitating the polymerization product produced through the above processes in a non-solvent.

The kind of the radical initiator is not particularly limited, which may be appropriately selected in consideration of polymerization efficiency, and for example, an azo compound such as AIBN (azobisisobutyronitrile) or 2,2'-azobis-(2,4-dimethylvaleronitrile), or peroxide series such as BPO (benzoyl peroxide) or DTBP (di-t-butyl peroxide) may be used.

The living radical polymerization process may be performed in a solvent such as, for example, methylene chloride, 1,2-dichloroethane, chlorobenzene, dichlorobenzene, benzene, toluene, acetone, chloroform, tetrahydrofuran, dioxane, monoglyme, diglyme, dimethylformamide, dimethylsulfoxide or dimethylacetamide.

As the non-solvent, an alcohol such as methanol, ethanol, normal propanol or isopropanol, a glycol such as ethylene glycol, n-hexane, cyclohexane, n-heptane or ether series such as petroleum ether can be used, without being limited thereto.

The present application also relates to a polymer film comprising the block copolymer. The polymer film may be used for various applications, and for example, may be used for various electric or electronic elements, a process of forming the pattern, a recording medium such as a magnetic storage medium and a flash memory, or a biosensor, and the like.

In one example, the block copolymer in the polymer film may implement a periodic structure including a sphere, a cylinder, a gyroid, a lamella, or the like through self-assembly.

For example, the polymer segments A to C in the block copolymer or another segment in the segments of the other segments covalently bonded thereto may form a regular structure such as a lamellar shape or a cylinder shape.

As described above, when the thin polymer film is formed, it may be appropriate to use a block copolymer having not too large molecular weight as described above. Here, the thin polymer film is a case where the thickness of the polymer film is about 40 nm or less. In this case, the lower limit of the thickness of the polymer film is not particularly limited, which may be, for example, about 1 nm or more, 5 nm or more, 10 nm or more, 15 nm or more, 20 nm or more, 25 nm or more or about 30 nm or more or so.

The present application also relates to a method for forming a polymer film using the block copolymer. The method may comprise forming a polymer film comprising the block copolymer in a self-assembled state on a substrate.

For example, the method may comprise a process of forming a layer of the block copolymer or a coating liquid in which the block copolymer is diluted in an appropriate solvent on the substrate by application or the like, and, if necessary, annealing or heat-treating the layer.

The annealing or heat treatment may be performed based on, for example, the phase transition temperature or the glass transition temperature of the block copolymer, and may be performed at, for example, a temperature above the glass transition temperature or the phase transition temperature. The time for which this heat treatment is performed is not particularly limited, and the treatment can be performed within a range of, for example, about 1 minute to 72 hours, but the time can be changed as needed. The heat treatment temperature of the polymer thin film may be, for example, about 100° C. to 250° C., but this may be changed in consideration of the block copolymer to be used.

In another example, the formed layer may also be subjected to solvent annealing in a non-polar solvent and/or a polar solvent at room temperature for about 1 minute to 72 hours.

The present application also relates to a patterning method. For example, the method may comprise a process of selectively removing polymer segments A, B and/or C of the block copolymer from a laminate having a substrate, and the polymer film formed on the surface of the substrate and comprising the self-assembled block copolymer. The method may be a method of forming a pattern on the substrate. For example, the method may comprise forming a polymer film comprising the block copolymer on a substrate, selectively removing one or more polymer segments of the block copolymer present in the film, and then etching the substrate. In this way, it is possible to form, for example, a nanoscale fine pattern. In addition, various types of patterns such as nano-rods or nano-holes can be formed through the above-described method depending on the shape of the block copolymer in the polymer film. If necessary, a copolymer different from the block copolymer or a homopolymer, and the like may be mixed for pattern formation. The type of the substrate to be applied to this method is not particularly limited and may be selected as needed, and for example, silicon oxide or the like may be applied.

For example, the method can form a nanoscale pattern of silicon oxide exhibiting a high aspect ratio. For example, after forming the polymer film on silicon oxide and selectively removing any one polymer segment of the block copolymer in a state where the block copolymer in the polymer film forms a predetermined structure, the silicon oxide may be etched by various ways, for example, reactive ion etching or the like to realize various shapes including patterns of nano-rods or nano-holes, and the like. In addition, a nanopattern having a large aspect ratio can be realized through such a method.

For example, the pattern can be implemented on a scale of several tens of nanometers, and such a pattern can be utilized for various applications including, for example, a next generation information electronic magnetic recording medium and the like.

The method of selectively removing any one polymer segment of the block copolymer in the above method is not particularly limited, and for example, a method of removing a relatively soft polymer segment by irradiating the polymer film with an appropriate electromagnetic wave, for example, ultraviolet or the like, can be used. In this case, the ultraviolet irradiation condition is determined according to the type of the polymer segment of the block copolymer, and the method can be performed, for example, by being irradiated with ultraviolet having a wavelength of about 254 nm for 1 minute to 60 minutes.

Also, following the ultraviolet irradiation, a step of treating the polymer film with an acid or the like to further remove the segment decomposed by ultraviolet may also be performed.

Furthermore, the step of etching the substrate using the polymer film in which the polymer segments are selectively removed as a mask is not particularly limited, which may be performed, for example, through a reactive ion etching step using $CF_4/Ar$ ions or the like and following this process, a step of removing the polymer film from the substrate by an oxygen plasma treatment or the like may also be performed.

Advantageous Effects

The present application may provide a block copolymer and a use thereof. The block copolymer of the present application has excellent self-assembly properties or phase separation characteristics, to which various functions to be required can also be freely imparted.

BRIEF DESCRIPTION OF DRAWINGS

FIGS. 1 and 2 are images of the self-assembled polymer films of Examples 1 and 2, respectively.

FIG. 3 is an image of the self-assembled polymer film of Comparative Example 1.

MODE FOR INVENTION

Hereinafter, the present application will be described in detail by way of examples according to the present application and comparative examples, but the scope of the present application is not limited by the following examples.

1. NMR Measurement

NMR analyses were performed at room temperature using an NMR spectrometer including a Varian Unity Inova (500 MHz) spectrometer with a triple resonance 5 mm probe. The analytes were diluted in a solvent for NMR measurement ($CDCl_3$) to a concentration of about 10 mg/ml, and chemical shifts were expressed in ppm.

<Application Abbreviation>
br=broad signal, s=singlet, d=doublet, dd=double doublet, t=triplet, dt=double triplet, q=quartet, p=quintet, m=multiplet.

2. GPC (gel permeation chromatograph)

The number average molecular weight (Mn) and the molecular weight distribution were measured using GPC (gel permeation chromatography). Into a 5 mL vial, an analyte such as block copolymers of Examples or Comparative Examples or a giant initiator is put and diluted in THF (tetrahydrofuran) to be a concentration of about 1 mg/mL or so. Then, a standard sample for calibration and a sample to be analyzed were filtered through a syringe filter (pore size: 0.45 μm) and then measured. As the analytical program, ChemStation from Agilent Technologies was used, and the elution time of the sample was compared with the calibration curve to obtain the weight average molecular weight (Mw) and the number average molecular weight (Mn), respectively, and the molecular weight distribution (PDI) was calculated by the ratio (Mw/Mn) thereof. The measurement conditions of GPC are as follows.

<GPC Measurement Condition>
Instrument: 1200 series from Agilent Technologies
Column: using two PLgel mixed B from Polymer Laboratories
Solvent: THF
Column temperature: 35° C.
Sample concentration: 1 mg/mL, 200 L injection
Standard sample: polystyrene (Mp: 3900000, 723000, 316500, 52200, 31400, 7200, 3940, 485)

Preparation Example 1

A compound (DPM-C12) of Formula A below was synthesized in the following manner. Hydroquinone (10.0 g, 94.2 mmol) and 1-bromododecane (23.5 g, 94.2 mmol) were placed in a 250 mL flask, dissolved in 100 mL of acetonitrile, and then an excess amount of potassium carbonate was added thereto and reacted at 75° C. for about 48 hours under a nitrogen atmosphere. The potassium carbonate remaining after the reaction and the acetonitrile used for the reaction were also removed. A mixed solvent of DCM (dichloromethane) and water was added thereto to work up the mixture, and the separated organic layer was dehydrated with $MgSO_4$. Subsequently, the product was purified by DC (dichloromethane) in CC (column chromatography) to obtain an intermediate in a white solid phase in a yield of about 37%.
<NMR Analysis Result of Intermediate>
$^1$H-NMR ($CDCl_3$): d6.77 (dd, 4H); δd4.45 (s, 1H); d3.89 (t, 2H); d1.75 (p, 2H); d1.43 (p, 2H); d1.33-1.26 (m, 16H); d0.88 (t, 3H).

The synthesized intermediate (9.8 g, 35.2 mmol), methacrylic acid (6.0 g, 69.7 mmol), DCC (dicyclohexylcarbodiimide) (10.8 g, 52.3 mmol) and DMAP (p-dimethylaminopyridine) (1.7 g, 13.9 mmol) were placed in the flask and 120 mL of methylene chloride was added thereto, and then reacted at room temperature for 24 hours in a nitrogen atmosphere. After the reaction, the salt (urea salt) generated during the reaction was filtered off and the remaining methylene chloride was also removed. Impurities were removed using hexane and DCM (dichloromethane) as the mobile phase in CC (column chromatography) and the resulting product was recrystallized in a mixed solvent of methanol and water (mixed at a weight ratio of 1:1) to obtain the target product (DPM-C12) (7.7 g, 22.2 mmol) in a white solid phase in a yield of 63%.
<NMR analysis result of DPM-C12>
$^1$H-NMR ($CDCl_3$): d7.02 (dd, 2H); δd6.89 (dd, 2H); d6.32 (dt, 1H); d5.73 (dt, 1H); d3.94 (t, 2H); δd2.05 (dd, 3H); d1.76 (p, 2H); δd1.43 (p, 2H); 1.34-1.27 (m, 16H); d0.88 (t, 3H).

[Formula A]

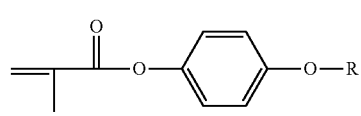

In Formula A, R is a linear alkyl group having 12 carbon atoms.

Preparation Example 2. Synthesis of Triblock Copolymer (A1)

5.0 g of the compound (DPM-C12) of Preparation Example 1 and 63.9 mg of an RAFT (reversible addition-fragmentation chain transfer) reagent (dCPD-TTC, didodecyl ((2S, 2'S)-(ethane-1,2-diylbis(azanediyl))bis(2-cyano-5-oxopentane-5,2-diyl)) dicarbonotrithioate), 23.7 mg of AIBN (azobisisobutyronitrile) and 11.87 g of anisole were placed in a 25 mL flask (Schlenk flask) and stirred at room temperature for 30 minutes under a nitrogen atmosphere, and then an RAFT (reversible addition-fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pink macro initiator. The number average molecular weight (Mn) and the molecular weight distribution (Mw/Mn) of the macro initiator were 15.7 Kg/mol and 1.22, respectively.

0.2 g of the macro initiator, 1.89 g of pentafluorostyrene, 0.8 mg of AIBN (azobisisobutyronitrile) and 0.70 g of anisole were placed in a 10 mL flask (Schlenk flask), stirred at room temperature for 30 minutes under a nitrogen atmosphere, and then an RAFT (reversible addition-fragmentation chain transfer) polymerization reaction was performed at 70° C. for 7 hours. After the polymerization, the reaction solution was precipitated in 250 mL of methanol as an extraction solvent, and then filtered under reduced pressure and dried to prepare a pale yellow triblock copolymer (A1). The number average molecular weight (Mn) and molecular weight distribution (Mw/Mn) of the block copolymer were 57.1 Kg/mol and 1.30, respectively. The block copolymer was in the form of the triblock copolymer in which polymer segments B and C derived from pentafluorostyrene were linked to both sides of the polymer segment A derived from the compound (DPM-C12) of Preparation Example 1.

In addition, the volume fraction of the polymer segment A (when the total volume fraction was taken as ') in the block copolymer was about 0.34.

Preparation Example 3. Synthesis of Triblock Copolymer (A2)

5.0 g of the compound (DPM-C12) of Preparation Example 1 and 61.0 mg of an RAFT (reversible addition-fragmentation chain transfer) reagent (dCPD-TTC, didodecyl ((2S, 2'S)-(ethane-1,2-diylbis(azanediyl))bis(2-cyano-5-oxopentane-5,2-diyl)) dicarbonotrithioate), 22.8 mg of AIBN (azobisisobutyronitrile) and 11.85 g of anisole were placed in a 25 mL flask (Schlenk flask) and stirred at room temperature for 30 minutes under a nitrogen atmosphere, and then an RAFT (reversible addition-fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pink macro initiator. The number average molecular weight (Mn) and the molecular weight distribution (Mw/Mn) of the macro initiator were 14.1 Kg/mol and 1.23, respectively.

0.2 g of the macro initiator, 1.73 g of pentafluorostyrene, 0.6 mg of AIBN (azobisisobutyronitrile) and 1.0 g of anisole were placed in a 10 mL flask (Schlenk flask), stirred at room temperature for 30 minutes under a nitrogen atmosphere, and then an RAFT (reversible addition-fragmentation chain transfer) polymerization reaction was performed at 70° C. for 5 hours. After the polymerization, the reaction solution was precipitated in 250 mL of methanol as an extraction solvent, and then filtered under reduced pressure and dried to prepare a pale yellow triblock copolymer (A2). The number average molecular weight (Mn) and molecular weight distribution (Mw/Mn) of the block copolymer were 41.3 Kg/mol and 1.31, respectively. The block copolymer was in the form of the triblock copolymer in which polymer segments B and C derived from pentafluorostyrene were linked to both sides of the polymer segment A derived from the compound (DPM-C12) of Preparation Example 1.

In addition, the volume fraction of the polymer segment A (when the total volume fraction was taken as ') in the block copolymer was about 0.46.

Preparation Example 4. Synthesis of Diblock Copolymer (A3)

5.0 g of the compound (DPM-C12) of Preparation Example 1 and 106.5 mg of an RAFT (reversible addition-fragmentation chain transfer) reagent (CPDB, 2-cyano-2-propyl benzodithioate), 39.5 mg of AIBN (azobisisobutyronitrile) and 12 g of anisole were placed in a 25 mL flask (Schlenk flask) and stirred at room temperature for 30 minutes under a nitrogen atmosphere, and then an RAFT (reversible addition-fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pink macro initiator. The number average molecular weight (Mn) and the molecular weight distribution (Mw/Mn) of the macro initiator were 17.9 Kg/mol and 1.27, respectively.

0.2 g of the macro initiator, 2.60 g of pentafluorostyrene, 0.9 mg of AIBN (azobisisobutyronitrile) and 0.93 g of anisole were placed in a 10 mL flask (Schlenk flask), stirred at room temperature for 30 minutes under a nitrogen atmosphere, and then an RAFT (reversible addition-fragmentation chain transfer) polymerization reaction was performed at 70° C. for 5 hours. After the polymerization, the reaction solution was precipitated in 250 mL of methanol as an extraction solvent, and then filtered under reduced pressure and dried to prepare a pale pink block copolymer (A3). The number average molecular weight (Mn) and molecular weight distribution (Mw/Mn) of the block copolymer were 55.8 Kg/mol and 1.36, respectively. The block copolymer was in the form of the diblock copolymer in which polymer segment B derived from pentafluorostyrene was linked to one side of the polymer segment A derived from the compound (DPM-C12) of Preparation Example 1.

Example 1

A self-assembled polymer film was formed using the triblock copolymer (A1) synthesized in Preparation Example 2, and the result was confirmed. Specifically, the copolymer was dissolved in fluorobenzene to a concentration of about 0.8 wt %, and spin-coated on a silicon wafer having a trench pattern (width 150 nm, depth 70 nm) to a thickness of about 32 nm (coating area: width 1.5 cm, height 1.5 cm). Thereafter, it was dried at room temperature for about 1 hour, again subjected to thermal annealing at a temperature of about 180° C. for about 1 hour and self-assembled. Thereafter, an SEM (scanning electron microscope) was photographed on the polymer film to evaluate self-assembly efficiency. FIG. 1 is the results for Example 1. From the drawing, it could be confirmed that an appropriate line pattern was formed in the case of Example 1.

Example 2

A self-assembled polymer film was formed using the triblock copolymer (A2) synthesized in Preparation Example 3, and the result was confirmed. Specifically, the copolymer was dissolved in fluorobenzene to a concentration of about 0.8 wt %, and spin-coated on a silicon wafer having a trench pattern (width 150 nm, depth 70 nm) to a thickness of about 32 nm (coating area: width 1.5 cm, height 1.5 cm). Thereafter, it was dried at room temperature for about 1 hour, again subjected to thermal annealing at a temperature of about 180° C. for about 1 hour and self-assembled. Thereafter, an SEM (scanning electron microscope) was photographed on the polymer film to evaluate self-assembly efficiency. FIG. 2 is the results for Example 2. From the drawing, it could be confirmed that an appropriate line pattern was formed in the case of Example 1.

Comparative Example 1

A self-assembled polymer film was formed using the diblock copolymer (A3) synthesized in Preparation Example 4, and the result was confirmed. Specifically, the copolymer was dissolved in fluorobenzene to a concentration of about 0.8 wt %, and spin-coated on a silicon wafer having a trench pattern (width 150 nm, depth 70 nm) to a thickness of about 32 nm (coating area: width 1.5 cm, height 1.5 cm). Thereafter, it was dried at room temperature for about 1 hour, again subjected to thermal annealing at a temperature of about 180° C. for about 1 hour and self-assembled. Thereafter, an SEM (scanning electron microscope) was photographed on the polymer film to evaluate self-assembly efficiency. FIG. 3 is the results for Comparative Example 1. From the drawing, it could be confirmed that, in the case of Comparative Example 1, even though it had molecular weight characteristics similar to those of the triblock copolymer of Example 1, an appropriate pattern was not formed and effective phase separation was not achieved.

The invention claimed is:

1. A block copolymer comprising a polymer segment A having a unit represented by Formula 4 below and polymer segments B and C different from the polymer segment A, wherein the block copolymer comprises a structure in which each of the polymer segments is connected in a form of B-A-C:

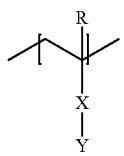

[Formula 4]

wherein, R is hydrogen or an alkyl group having 1 to 4 carbon atoms, X is a single bond, an oxygen atom, —C(=O)—O— or —O—C(=O), and Y is a monovalent substituent comprising an aromatic ring structure to which a chain having 8 to 20 chain-forming atoms is linked, wherein the polymer segments B and C comprise a unit of Formula 7 below:

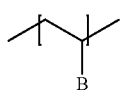

[Formula 7]

wherein, B is a monovalent substituent having an aromatic structure comprising one or more halogen atoms.

2. The block copolymer according to claim 1, wherein X is —C(=O)—O—.

3. The block copolymer according to claim 1, wherein each of the chain-forming atoms is independently carbon, oxygen, nitrogen or sulfur.

4. The block copolymer according to claim 1, wherein each of the chain-forming atoms is independently carbon or oxygen.

5. The block copolymer according to claim 1, wherein the chain is a hydrocarbon chain.

6. The block copolymer according to claim 1, wherein the chain of Y is linked to the ring structure via a linker.

7. The block copolymer according to claim 6, wherein the linker is an oxygen atom, a sulfur atom, —NR$_3$—, —S(=O)$_2$—, an alkylene group, an alkenylene group or an alkynylene group, where R$_3$ is an alkenyl group, an alkynyl group, an alkoxy group or an aryl group.

8. The block copolymer according to claim 1, wherein Y is represented by Formula 2 below:

—P-Q-Z    [Formula 2]

wherein, P is an arylene group, Q is a single bond, an oxygen atom or —NR$_3$—, where R$_3$ is hydrogen, an alkyl group, an alkenyl group, an alkynyl group, an alkoxy group or an aryl group, and Z is a chain having 8 or more chain-forming atoms.

9. The block copolymer according to claim 1, wherein the unit of Formula 7 is represented by Formula 8 below:

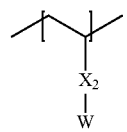

[Formula 8]

wherein, X$_2$ is a single bond, an oxygen atom, a sulfur atom, —S(=O)$_2$—, an alkylene group, an alkenylene group, an alkynylene group, —C(=O)—X$_1$— or —X$_1$—C(=O)—, where X$_1$ is a single bond, an oxygen atom, a sulfur atom, —S(=O)$_2$—, an alkylene group, an alkenylene group or an alkynylene group, and W is an aryl group containing at least one halogen atom.

10. The block copolymer according to claim 1, wherein the unit of Formula 7 is represented by Formula 9 below:

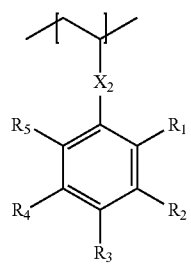

[Formula 9]

wherein, X$_2$ is a single bond, an oxygen atom, a sulfur atom, —S(=O)$_2$—, an alkylene group, an alkenylene group, an alkynylene group, —C(=O)—X$_1$— or —X$_1$—C(=O)—, where X$_1$ is a single bond, an oxygen atom, a sulfur atom, —S(=O)$_2$—, an alkylene group, an alkenylene group or an alkynylene group, R$_1$ to R$_5$ are each independently hydrogen, an alkyl group, a haloalkyl group or a halogen atom, and the number of halogen atoms contained in R$_1$ to R$_5$ is 1 or more.

11. The block copolymer according to claim 1, wherein the polymer segment A has a volume fraction in a range of 0.3 to 0.5.

12. A polymer film comprising a self-assembled structure of the block copolymer of claim 1.

13. The polymer film according to claim 12, wherein the block copolymer has a number average molecular weight of 70,000 g/mol or less and a thickness of 40 nm or less.

14. A method for forming a polymer film, comprising forming on a substrate a polymer film comprising the self-assembled block copolymer of claim 1.

15. A patterning method comprising a process of selectively removing any one of polymer segments of a self-assembled structure of the block copolymer of claim 1 from a laminate having a substrate and a polymer film which is formed on the substrate and comprises the block copolymer.

* * * * *